United States Patent
Donjon et al.

(10) Patent No.: US 9,779,721 B2
(45) Date of Patent: Oct. 3, 2017

(54) SPEECH PROCESSING USING IDENTIFIED PHONEME CLASES AND AMBIENT NOISE

(71) Applicant: NXP B.V., Eindhoven (NL)

(72) Inventors: Aurelie Donjon, Sophia Antipolis (FR); Cyril Guillaume, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/730,946

(22) Filed: Jun. 4, 2015

(65) Prior Publication Data

US 2016/0189707 A1  Jun. 30, 2016

(30) Foreign Application Priority Data

Dec. 24, 2014  (EP) .................................. 14290401

(51) Int. Cl.
| | |
|---|---|
| *G10L 15/02* | (2006.01) |
| *G10L 21/0364* | (2013.01) |
| *H03G 7/00* | (2006.01) |
| *G10L 21/0232* | (2013.01) |
| *H04W 88/02* | (2009.01) |
| *H03G 9/00* | (2006.01) |
| *H03G 9/02* | (2006.01) |

(Continued)

(52) U.S. Cl.
CPC .......... *G10L 15/02* (2013.01); *G10L 21/0232* (2013.01); *G10L 21/0364* (2013.01); *H03G 7/002* (2013.01); *H03G 7/007* (2013.01); *H03G 9/005* (2013.01); *H03G 9/025* (2013.01); *H04W 88/02* (2013.01); *G10L 21/0208* (2013.01); *G10L 25/51* (2013.01); *G10L 2015/025* (2013.01)

(58) Field of Classification Search
CPC ............... H04W 88/02; G10L 21/0232; G10L 2015/025
See application file for complete search history.

(56) References Cited

U.S. PATENT DOCUMENTS

| | | | | |
|---|---|---|---|---|
| 3,946,157 A | * | 3/1976 | Dreyfus .................. | G10L 15/10 367/198 |
| 8,626,516 B2 | | 1/2014 | Zeng et al. | |

(Continued)

FOREIGN PATENT DOCUMENTS

| | | |
|---|---|---|
| EP | 1 168 306 A2 * | 1/2002 |
| WO | 01/24416 A1 | 4/2001 |
| WO | 2009/135192 A1 | 11/2009 |

OTHER PUBLICATIONS

Chen, F. et al. "Contributions of Cochlea-Scaled Entropy and Consonant-Vowel Boundaries to Prediction of Speech Intelligibility in Noise", J. Acoust. Soc. Am., vol. 141, No. 5 pp. 4104-4113 (May 2012).

(Continued)

*Primary Examiner* — Qian Yang
(74) *Attorney, Agent, or Firm* — Rajeev Madnawat

(57) ABSTRACT

A wireless communication device is disclosed. The wireless communication device includes a processor, a memory, a transceiver configured to receive an audio signal, a codec to decode the audio signal, a dynamic range controller and a phoneme processor. The phoneme processor is configured to extract acoustic cues from each frame of the decoded audio signal and to identify a phoneme class in the each frame. The dynamic range controller is configured to apply dynamic range compression on the each frame based on the identified phoneme class.

20 Claims, 4 Drawing Sheets

(51) Int. Cl.
　　　*G10L 25/51*　　　(2013.01)
　　　*G10L 21/0208*　　(2013.01)

(56) References Cited

U.S. PATENT DOCUMENTS

| | | | | |
|---|---|---|---|---|
| 2003/0204394 | A1* | 10/2003 | Garudadri | G10L 15/02 |
| | | | | 704/201 |
| 2010/0057452 | A1* | 3/2010 | Mukerjee | G10L 15/16 |
| | | | | 704/232 |
| 2012/0143600 | A1* | 6/2012 | Iriyama | G10L 13/08 |
| | | | | 704/207 |
| 2012/0209601 | A1* | 8/2012 | Jing | G10L 21/0364 |
| | | | | 704/226 |
| 2015/0104031 | A1* | 4/2015 | Park | G10K 11/1788 |
| | | | | 381/71.6 |

OTHER PUBLICATIONS

Kumar, A. et. al. "Design of Nearly Perfect Reconstructed Non-Uniform Filter Bank by Constrained Equiripple FIR Technique", Applied Soft Computing, vol. 13, issue 1, pp. 353-360 (Jan. 2013).
Cassidy, R. J. et al. "A Tunable, Nonsubsampled, Non-uniform Filter Bank for Multi-Band Audition and Level Modification of Audio Signals", Conf, Rec. of the Thirty-Eighth Asilomar Conf. on the Signals, Systems and Computers, vol. 2, pp. 2228-2232 (Nov. 2004).
Extended European Search Report for EP Patent Appln. No. 14290401.0 (dated Jun. 10, 2015).

\* cited by examiner

SPEECH PROCESSING USING IDENTIFIED PHONEME CLASES AND AMBIENT NOISE

CROSS-REFERENCE TO RELATED APPLICATIONS

This application claims the priority under 35 U.S.C. §119 of European patent application no. 14290401.0, filed on Dec. 24, 2014, the contents of which are incorporated by reference herein.

FIELD OF INVENTION

This invention relates to a method and apparatus for enhancing audio signal quality.

BACKGROUND

In mobile devices, noise reduction technologies greatly improve the audio quality to regain speech intelligibility, especially for the far-end listener. The near-end listener, located in noisy environment, also experiences reduced speech intelligibility of the far-end talker.

A conventional Dynamic Range Controller (DRC) is typically used in modern mobile phones audio chains for voice calls. A use of DRC in audio processing systems is described in U.S. Pat. No. 8,626,516 (Zeng et. al.), which is incorporated herein by reference. The DRC is often applied on the received signal in order to maximize the loudness of the incoming speech for the mobile device user. However, when the DRC is tuned aggressively in an attempt to make the sound louder, some speech sounds, like the fricatives, are too much emphasized and sound very harsh, resulting in a poor subjective quality.

To improve the speech intelligibility in noisy environments, the Active Noise Cancellation (ANC) is an attractive proposition for headsets and the ANC does improve audio reproduction in noisy environment to certain extents. The ANC method has less or no benefits, however, when the mobile phone is being used without ANC headsets. Moreover the ANC method is limited in the frequencies that can be cancelled.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a wireless communication device is disclosed. The wireless communication device includes a processor, a memory, a receiver configured to receive an audio signal, a codec to decode the audio signal, a dynamic range controller and a phoneme processor. The phoneme processor is configured to extract acoustic cues and to identify a phoneme class in each frame of the decoded audio signal. The dynamic range controller is configured to apply dynamic range compression on the each frame based on the identified phoneme class.

In another embodiment, a method of enhancing audio signal quality is disclosed. The method comprises receiving an audio signal, decoding the audio signal, extracting acoustic cues from each frame of the decoded audio signal, identifying a phoneme class in the each frame and applying dynamic range compression on each frame based on the identified phoneme class.

In yet another embodiment, a computer readable media including programming instructions, which when executed by a processor perform an operation of enhancing audio signal quality, is disclosed. The operation comprises receiving an audio signal, decoding the audio signal, extracting acoustic cues from each frame of the decoded audio signal, identifying a phoneme class in the each frame, and applying dynamic range compression on each frame based on the identified phoneme class.

The phoneme class is selected from a preselected group of phoneme classes. Each phoneme class in the preselected group of phoneme classes corresponds to energy level of an audio signal frame and acoustic cues in the audio signal frame.

The wireless communication device further includes a filter bank to separate the audio signal into frequency based sub bands. The filter bank is configured to process the audio signal before the audio signal is inputted to the phoneme processor.

The dynamic range controller includes separate compressors for each frequency based sub band and the wireless communication device further includes an ambient noise estimator coupled to a microphone. Each separate compressor processes a particular frequency sub band and a dynamic range compression is applied on the particular frequency sub band based on an output of the ambient noise estimator and an output of the phoneme processor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

DETAILED DESCRIPTION

When a user makes a mobile phone call in a noisy place, the far-end speech becomes unintelligible. Typically, in such cases, the user will preferably switch to handset mode, apply more contact pressure between the phone receiver and his ear and increase the volume of his phone. As a result, the user experiences a poor user experience. Increasing volume of the phone can lead to uncomfortable listening and even degraded intelligibility as the level of saturation, compression and acoustical distortion increases. Various embodiments of the present disclosure improve the user experience by enhancing speech intelligibility and reproduction quality.

As positioning, holding of the mobile phone as well as the distance between the phone receiver and the user's ear can be variable, a configurable software and/or hardware based solution that enhances the speech adaptively to the noise is well suited, instead of an active noise cancelling based solution.

The embodiments described herein aim to improve the speech intelligibility on mobile phone loudspeaker output. Some acoustic features in the speech signal are quite important for the intelligibility of the speech; they may be responsible to make some phonemes distinct from each other. In addition, different frequency bands have different importance for different phonemes. Contrary to common speech DRC which will boost low level parts (e.g., consonants), and compress high level parts (e.g., vowels) of the speech signal, an acoustic features detector and a phoneme classifier can be used to control different DRCs, so that some phonetic features of the speech signal are enhanced to make them more salient, thus also making them more robust in noisy reproduction environment.

The embodiments described herein may also be used to improve the reproduction quality of speech on mobile phones by avoiding the conventional DRC to over boost the sibilants, thus degrading the speech quality. The sibilants contains most of their energy in the higher frequencies (e.g., frequencies greater than 4 kHz) which are typically cut due to the bandwidth limitation of speech codecs. Contrary to de-essing techniques that aim at removing prominent sibilant consonants ("s", "z", "ch", etc.), the embodiments described herein prevents these sharp sibilants caused by typical DRC processing to be introduced or amplified further.

Figure 1A:
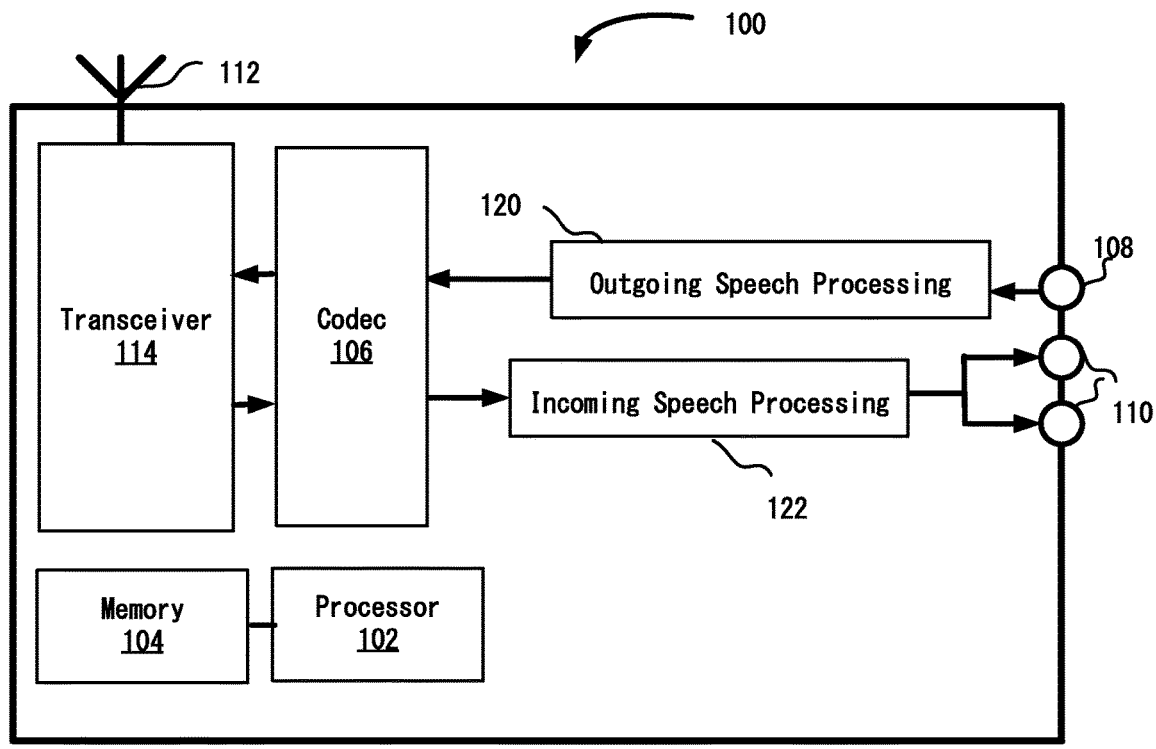
FIG. 1A is schematic of a portion of a wireless communication device in accordance with one or more embodiments of the present disclosure.

FIG. 1A is schematic of a wireless communication device 100. So as not to obscure the embodiments described herein, many components of the wireless communication device 100 are not being shown. The wireless communication device 100 may be a mobile phone or any mobile device that is capable of establishing an audio/video communication link with another communication device. The wireless communication device 100 includes a processor 102, a memory 104, a transceiver 114, and an antenna 112. Note that the antenna 112, as shown, is merely an illustration. In reality, the antenna 112 may be an internal antenna or an external antenna and may be shaped differently than shown. Furthermore, in some embodiments, there may be a plurality of antennas. The transceiver 114 includes a transmitter and a receiver in a single semiconductor chip. In some embodiments, the transmitter and the receiver may be implemented separately from each other. The processor 102 includes suitable logic and programming instructions (may be stored in the memory 104 and/or in an internal memory of the processor 102) to process communication signals and control at least some processing modules of the wireless communication device 100. The processor 102 is configured to read/write and manipulate the contents of the memory 104. The wireless communication device 100 also includes one or more microphone 108 and speaker(s) and/or loudspeaker(s) 110. In some embodiments, the microphone 108 and the loudspeaker 110 may be external components coupled to the wireless communication device 100 via standard interface technologies such as Bluetooth.

The wireless communication device 100 also includes a codec 106. The codec 106 includes an audio decoder and an audio coder. The audio decoder decodes the signals received from the receiver of the transceiver 114 and the audio coder codes audio signals for transmission by the transmitter of the transceiver 114. On uplink, the audio signals received from the microphone 108 are processed for audio enhancement by an outgoing speech processing module 120. On the downlink, the decoded audio signals received from the codec 106 are processed for audio enhancement by an incoming speech processing module 122. In some embodiments, the codec 106 may be a software implemented codec and may reside in the memory 104 and executed by the processor 102. The coded 106 may include suitable logic to process audio signals. The codec 106 may be configured to process digital signals at different sampling rates that are typically used in mobile telephony. The incoming speech processing module 122 is configured to apply dynamic range compression on a speech frame of the decoded audio signal based on detected phoneme classes in the speech frame. The decoded audio signal is analyzed in small frames and the decoded audio signal is separated into frequency sub bands. Each frame in a sub band is analyzed to determine a phoneme class based on, for example, signal energy levels, voicing activity and rate of change in signal energy. In addition, in some embodiments, the dynamic range compression may also be applied based on the ambient noise detection through the microphone 108. In some embodiments, the audio enhancing process in the downlink may also use other processing modules as describes in the following sections of this document.

In one embodiment, the outgoing speech processing module 120 uses noise reduction, echo cancelling and automatic gain control to enhance the uplink speech. Further details of provided in the following sections of this document.

Figure 1B:
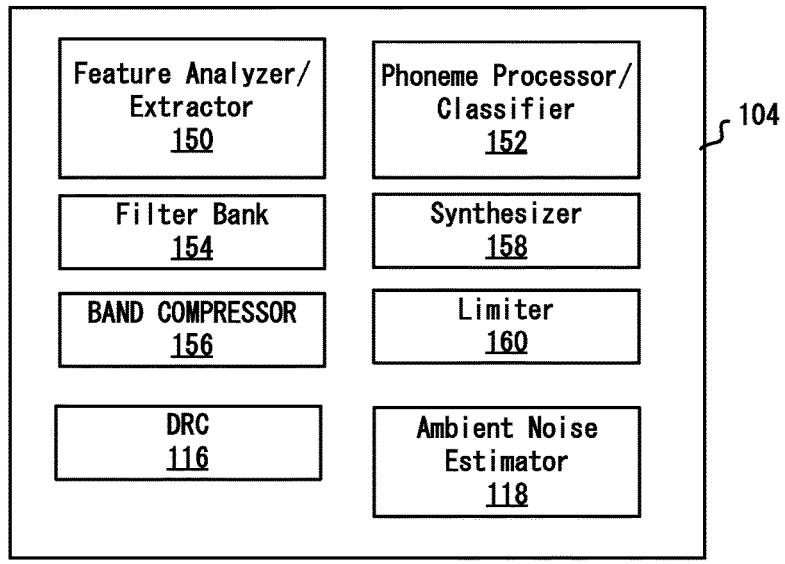
FIG. 1B is logical depiction of a portion of a memory of the wireless communication device in accordance with one or more embodiments of the present disclosure.

FIG. 1B is logical depiction of a portion of a memory 104 of the wireless communication device 100. It should be noted that at least some of the processing modules depicted in FIG. 1B may also be implemented in hardware. In one embodiment, the memory 104 includes programming instructions which when executed by the processor 102 create a feature analyzer/extractor 150 to analyze speech signals. Using the feature analyzer/extractor 150, the speech signal is analyzed into short fixed size frames to detect and extract acoustic cues. Features are computed on each speech frame.

The dynamic range compression is provided by a DRC 116. In some embodiments, the DRC 116 may be a part of the codec 106. In some other embodiments, the DRC 116 may reside in the memory 104 and executed by the processor 102. In some other embodiments, the codec 106 and the DRC 116 may be implemented in hardware separate from each other. The wireless communication device 100 may include a noise estimator 118. The noise estimator 118 may be implemented in software and may reside in memory 104 and executed by the processor 102. In other embodiments, the noise estimator 118 may be implemented in hardware. The noise estimator 118 is configured to estimate ambient noise component in the audio signals captured by the microphone 108.

The memory 104 also includes programming instruction to create a phoneme processor/classifier 152 to identify phonemes in the frames of the incoming speech/audio signal. The phonemes are then classified into one of the preselected sound classes. Broad or coarse phoneme classes are computed using Root Mean Square (RMS) (i.e., calculation of speech energy), level based segmentation, "Contributions of cochlea-scaled entropy and consonant-vowel boundaries to prediction of speech intelligibility in noise," by Fei Chen and Philipos C. Loizou (2012), which is being incorporated herein by reference, and voicing detector (e.g., combination of spectral centroid/namdf/gradient index measurement). Fine sound or phonetic classes are calculated using frequency spreading over bands that is, a measurement if spectrum is more or less flat/maximum band energy/energy level change (rate of energy change between 2 consecutive frames).

It is beneficial to apply less boost on the sibilant sounds, the detection of all classes of phonemes is not needed for this speech reproduction quality improvement application. Typically, four classes of phonemes are sufficient for optimal results. These sound classes include fricatives, plosives, vowels-like consonants, and vowels. The classifier outputs a probability for each sound class, that the input fixed frame being analyzed belongs to the each sound class.

In some embodiments, the phone classifier 152 may include the features of the feature extractor 150. The phoneme classifier 152 operates with the help of a statistical model that is trained based on low-level features extracted from the incoming speech signal. A feature vector is made out of the following features: the zero-crossing rate, the spectral centroid, the local kurtosis, auto-correlation coefficients, the gradient index and the normalized frame energy. The first-order and second order derivatives of these features are appended to a vector to form a composite feature vector. The size of this composite feature vector is then reduced by means of a matrix multiplication trained offline via a Linear Discriminant Analysis (LDA). A first order Hidden Markov Model (HMM), with four states corresponding to the phonetic sound classes defined previously, is then used to decode the probability for every sound class. Every HMM state is modeled by a Gaussian Mixture Model (GMM) with diagonal covariance matrix. The sum of the four probabilities is one.

The memory 104 may also include programming instructions to create a non-uniform nearly perfect reconstruction filter bank 154 to decompose the speech signal in frequency sub bands. Sub band signals can be analyzed for features extraction and amplified by sub band compressors 156. In some embodiments, there is a separate band compressor 156 for each sub band.

The memory 104 may also include programming instructions for creating a synthesizer 158 and a limiter 160. The synthesizer 158 is configured to reconstruct an enhanced speech signal from the output of the DRC 116. The limiter 160 is configured to process the enhanced speech signal to prevent the clipping effect.

Figure 1C:
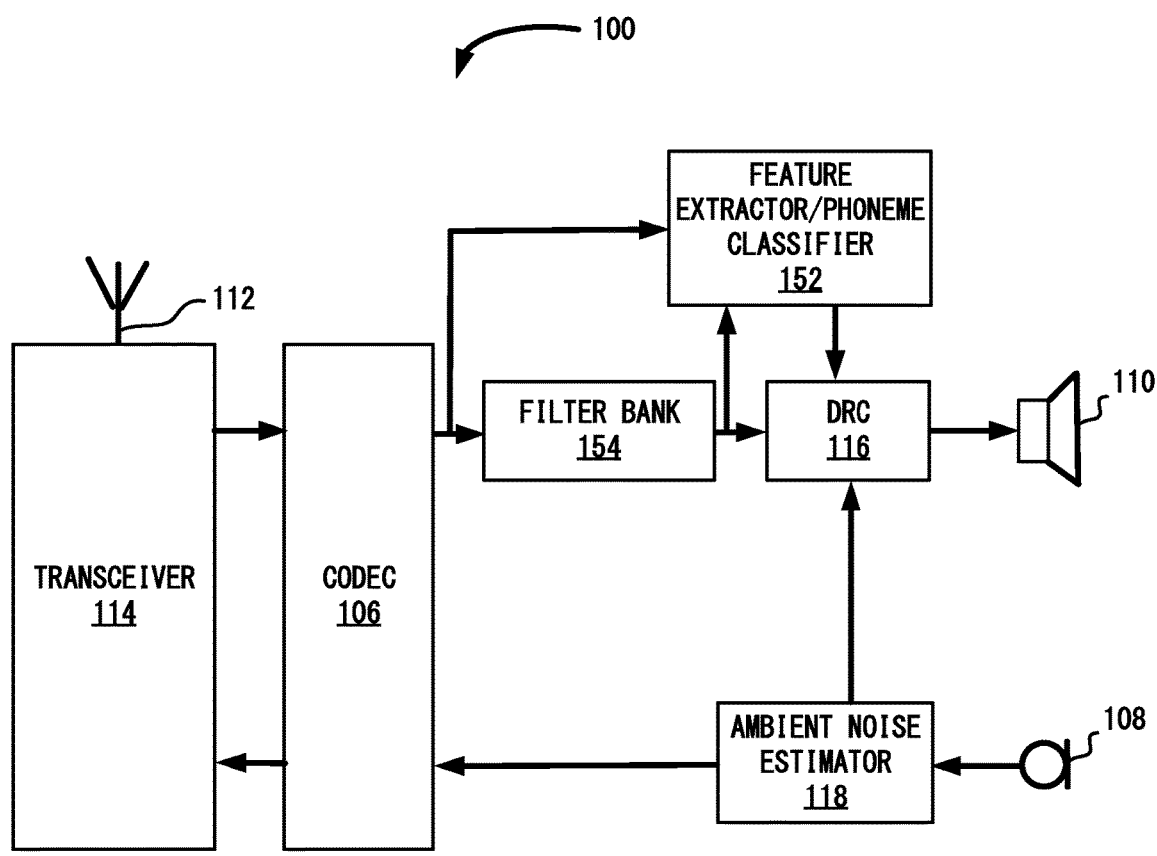
FIG. 1C is schematic of a portion of a wireless communication device in accordance with one or more embodiments of the present disclosure.

FIG. 1C illustrates enhanced speech processing at the receiver side, in the wireless communication device 100. The wireless communication device 100 includes a transceiver 114 that includes a receiver for receiving incoming communication signals and a transmitter for transmitting outgoing signals, via the antenna 112. The codec 106 includes an audio decoder that converts the incoming communication signals into audio signals. The audio signals are inputted to a filter bank 154 to separate the incoming audio signal into a plurality frequency based sub bands. Each sub band signal, as well as the full band signal, is inputted to a feature extractor/phoneme classifier 152. The full band and sub band signals are analyzed in small frames for extracting features separately in each sub band. Based on extracted features, a sound or phonetic class (from a predefined group of phonetic or sound classes) is identified in each frame. A more details on sound classes may be found later in this document. Each sound class defines a level of compression or gain that should be applied to the frame in which the each sound class is detected. Using a sub band DRC (for each sub band), a predefined compression or gain is applied to each frame in each sub band based on the detected sound class.

The output of each of the sub band DRC is combined using the synthesizer 158 and outputted to the speaker 110. In some embodiments, the output of the synthesizer may be passed through a limiter to prevent clipping effect in the output sound signals.

In some embodiments, the sub band DRCs may also factor ambient noise parameters provided by the ambient noise estimator 118 to modify the amount of gain and compression to be applied on each frame. Accordingly, the amount of gain and compression for a same sound or phonetic class in a frame may be reduced in low ambient noise environment or may be increased in relatively high ambient noise environment. In some embodiments, if the ambient noise levels are below a preselected threshold, no dynamic range compression may be applied to the frames.

Figure 2:
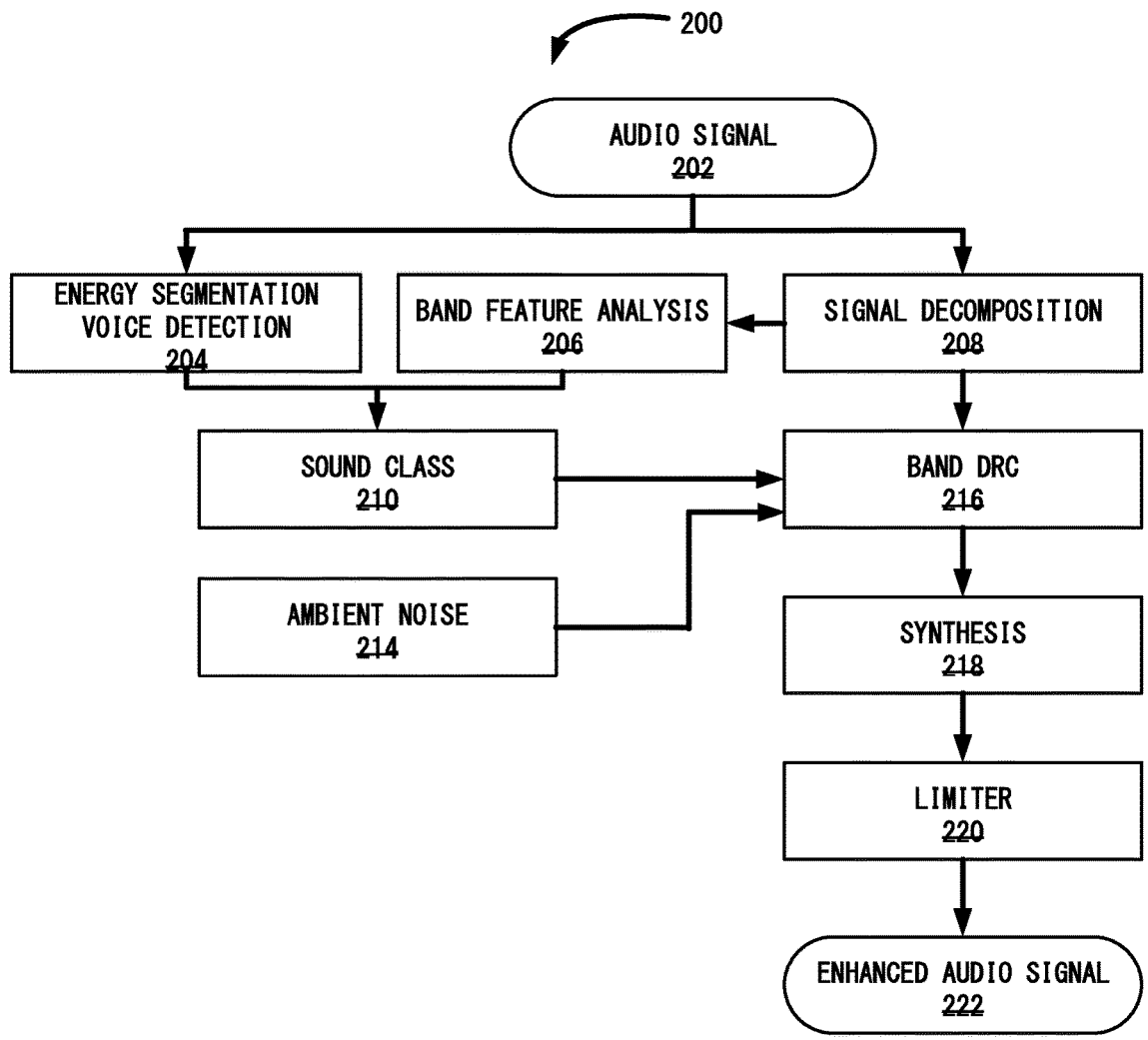
FIG. 2 illustrates a flow diagram for improving speech intelligibility in noisy environment using a phonetically driven dynamic range controller in accordance with one of more embodiments of the present disclosure.

FIG. 2 illustrates a method 200 for improving speech intelligibility, especially in noisy environment, using a phonetically driven dynamic range controller. Various modules that implements the method 200 may be implemented in software that may reside in the memory 104 and executed by the processor 102. The implementation of the method 200 may be a part of the codec 106 in some embodiments. In other embodiments, the method 200 may be implemented separate from the codec 106.

At step 202, an audio signal is received by the voice codec 106. The received audio signal is analyzed in short fixed size frames to detect areas of acoustic cues. At step 208, the received audio signal is decomposed in frequency sub bands by a non-uniform nearly perfect reconstruction filter bank. The non-uniform nearly perfect reconstruction filter bank is explained in "Design of nearly perfect reconstructed non-uniform filter bank by constrained equiripple FIR technique," by Kumar et. al., Applied Soft Computing, Volume 13, Issue 1, January 2013, Pages 353-360 and "A tunable, nonsubsampled, non-uniform filter bank for multi-band audition and level modification of audio signals", by Ryan J. Cassidy and Julius O. Smith, which are incorporated herein by reference.

At step 204, the audio signal is classified based on a full band speech energy level segmentation coupled with voicing detection. This classification outputs main coarse sound classes. At step 206, the sub band signals are analyzed for feature extraction. At step 210, from main classes and computed features, a sound class detector is used to identify sound class or classes of phonemes in the received audio signal. In one embodiment, a rough determination of the ambient environment with known type of background noises such as street, office, bar, etc. is also determined. In one embodiment, merely for easy understanding for the disclosure, four preselected classes of phonemes have been defined: fricatives, plosives, vowels-like consonants, and vowels.

In some embodiments, bandwidths and cutoff frequencies are fixed and chosen in accordance with the extracted speech features and phonetic classes searched in input signal frames. At step 216, sub bands are amplified by sub band compressors that take into account the ambient noise levels detected at step 214 and a sound class determined at step 210. Each sub band has a compressor with its own static characteristic including the linear gain region and the compression region. Sub bands' maximum gains of the linear region as well as compression knees and ratios are tuned depending on other processing in the voice chain (e.g., equalizer, gains . . . ) and acoustics of the wireless communication device 100.

Some additional features may be computed in sub bands, such as frequency band energies rate of change, ratio and spreading. These features are used for detection of fine sound classes. Detection thresholds are determined by training and adapted to the measured speech noise floor. Detection thresholds are decision thresholds for extracted features, which are determined by learning process. For example, RMS greater than a first energy threshold with detected voicing activity may indicate a first phonetic/sound class and frequency spreading over band greater than a first frequency spreading threshold may indicate a particular phonetic subclass. In some embodiments, the sound class detection of step 210 is disabled in case of too much noise in the speech signal. In such cases, sub band compressors are not driven by phonetic cues detection and phoneme classes. Sub band compressors gains are also limited in case of too much noise in the input speech signal.

Each sound class has predefined sub bands weighting ratios, corresponding to predefined sub bands amount of compressions or gains. These ratios are chosen in order to spectrally enhance phonetic cues for reproduction in noisy environment, such as to improve the intelligibility and preserve the reproduction quality of a phoneme.

Not every phoneme contribute in the same way to the speech intelligibility—there are speech features which are important for intelligibility. A change in some distinctive speech features can result in a change in phoneme so that these features are related to speech intelligibility. High amplification of low level speech sounds like fricatives, which, when too much emphasized, sound harsh and negatively impacting the audio reproduction quality. In some embodiments, sub band compression levels for each coarse and fine phonetic/sound class are predefined. Hence, once a phonetic or sound class is determined in a frame, a preselected compression is applied to that frame.

In some embodiments, in addition to applying compression based on detected phonetic/sound class in a frame, to improve speech intelligibility (at the output of phone receiver) and adapts audio quality, ambient noise level is also considered as a factor in determining how much compression to be applied on each frame. An amount of gain controlled by the environmental noise level may be used to increase the speech loudness, ensuring audibility, as a first required step in speech intelligibility enhancement, while taking into account digital headroom and output acoustics limitations. This ambient noise based gain adjustment allows the maximization of the linear region.

In some embodiments, amounts of compressions based on the identified phonetic classes in frames may be reduced or increased based on ambient noise levels.

In some embodiments, in addition to phonetic/sound class based compressions, the amount of loudness increase (DRC gain) is also controlled by ambient noise levels. Noise levels can be monitored in each band such as to take into account the main spectral distribution of ambient noise (e.g., high frequency noise or low frequency noise). A compressor gain is updated between zero decibel and a preselected maximum gain in accordance with the measured ambient noise level, which, in one embodiment, may lie between two noise thresholds, corresponding to the two extreme gains values. This gain adjustment based on the ambient noise level, allows the maximization of the linear region and gain, as well as the amount of compression, are reduced in low noise level environments. The static characteristic (relationship between the input and output levels) of each compressor is then updated depending on the ambient noise level estimation.

A frequency based sub band compressor's dynamics characteristics (e.g., time the compressor takes to react to a change in input level) are designed specifically for the speech signal and the sub band. Each sub band gain is first determined by the received speech energy level and the sub band compressor static characteristic. In some embodiments, sub band's weighting ratios, determined by a determined sound class, are applied with the following constraints:

(a) Sub band gain cannot be greater than the specified maximum DRC gain;
(b) If the sub band input energy requires compression, in accordance with the sub band compressor characteristic, the weighted sub band gain cannot be greater than the gain with the required amount of compression; and
(c) Weighted sub bands gains cannot lead to input signal attenuation.

Given these constraints, frequency band weighting ratios are applied, sub band being either in linear or in compression regions. If these requirements cannot be fulfilled, frequency gains are applied independently by each sub band compressor, depending only on the sub band input energy and the sub band compressor static characteristic. In some embodiments, amount of gain is also adapted to the environmental noise level. In some embodiments, amount of gain is also limited in case of too much noise in the input speech signal (e.g., degraded Signal to Noise Ratio).

At step 218, sub band signals, after compression, are combined to produce a synthesized audio signal and at step 220 the synthesized audio signal is passed through a limiter to prevent signal clipping at later stages. Subsequently, an enhanced far end speech is received at step 222.

Figure 3:
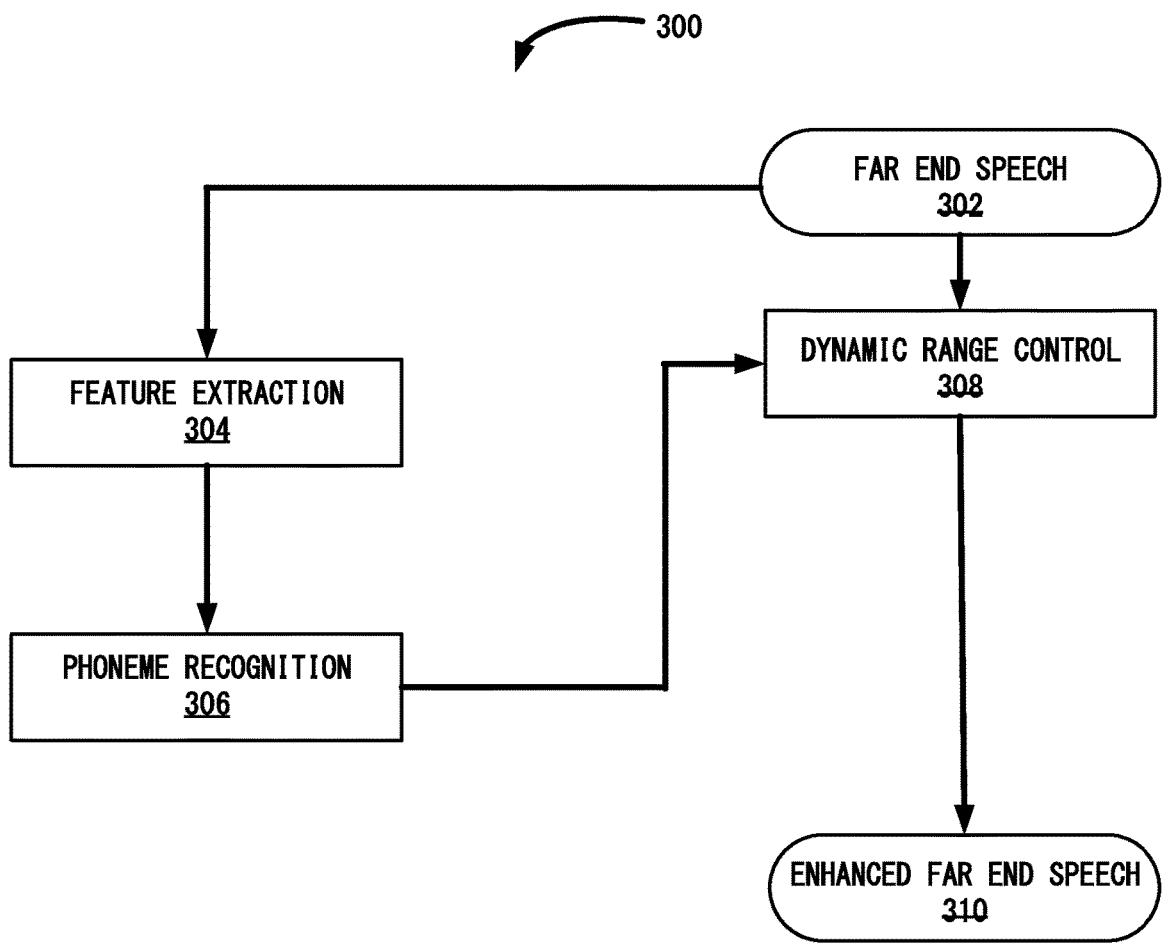
FIG. 3 illustrates a flow diagram for improving speech reproduction quality using a phonetically driven dynamic range controller in accordance with one or more embodiments of the present disclosure.

FIG. 3 illustrates a method 300 for enhancing speech signals received at the wireless mobile device 100 from another device in which the user of an another device used the another device in a noisy environment using a handset or hand's free mode.

At step 302, a voice signal is received representing a speech inputted to a device using a hand's free mode. At step 304, speech features are extracted from the received speech signals and at step 306, phonemes are recognized. At step 308, the received speech signals and recognized phonemes are inputted in a dynamic range controller. The phoneme recognition includes identifying phonetic/sound classes. For easy understanding and as an example, four classes of phonemes have been defined: fricatives, plosives, vowels-like consonants, and vowels. The sound classifier outputs a probability pi, for each class, that the input frame k belongs to class i.

A statistical model is trained based on low-level features extracted from the received speech signal. A feature vector is made out of the following features: the zero-crossing rate, the spectral centroid, the local kurtosis, a plurality of auto-correlation coefficients, the gradient index and the normalized frame energy. The first-order and second order derivatives of these features are appended to the vector to form a composite feature vector. The size of this composite feature vector is then reduced by means of a matrix multiplication trained offline via a Linear Discriminant Analysis (LDA). A first order Hidden Markov Model (HMM), with four states corresponding to the preselected phonetic classes, is then used to decode a probability for every class. Every HMM state is modeled by a Gaussian Mixture Model (GMM) with diagonal covariance matrix. The sum of the four probabilities is one.

For each sound class a DRC static characteristic is associated, including the linear gain region and the compression region. The final static characteristic of the DRC is computed from a weighted averaging of the individual DRC's input/output energy transfer functions. In the averaging, weights applied to each function is derived from the decoded probability for each sound class multiplied by an extra parameter $\alpha_i$, which may be tuned differently for every sound class. This extra parameter allows for different trade-offs between the different phonetic classes. The maximum of $\alpha_i * p_i$ and 1.0 is used before summation as a weight. In other words, if fi(input_level) is the output level computed from the DRC characteristics fi of class i, then the overall output level is:

$$\text{output\_level} = \Sigma_{i=1}^{4} \text{MAX}\{p_i, \alpha_i, 1.0\} \cdot f_i(\text{input\_level})$$

At step 310, the enhanced far end speech is played to the speakers 110 of the wireless mobile device 100.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A wireless communication device, comprising:
    a receiver configured to receive a wireless signal containing an audio signal;
    a codec configured to decode the audio signal;
    a dynamic range controller including circuitry and configured to enhance the decoded audio signal by applying compression and gains to energy levels of portions of the decoded audio signal;
    an ambient noise estimator configured to detect ambient noise; and
    a phoneme processor, configured and arranged with the dynamic range controller as part of a computer processor with computer-executable instructions in a memory to enhance audio signal quality by extracting acoustic cues from frames of the decoded audio signal and by identifying a phoneme class in the frames, wherein the dynamic range controller is configured to apply dynamic range compression on the frames based on the identified phoneme class and ambient noise detected by the ambient noise estimator for a corresponding frame, and to provide a signal for broadcast via a speaker, from application of the dynamic range compression by the dynamic range controller,
    wherein the dynamic range controller applies the compression and gains by:
        processing a plurality of frequency sub bands corresponding to the audio signal; and
        applying, for each of the plurality of frequency sub bands, a weight that is based on an output of the ambient noise estimator and an output of the phoneme processor.

2. The wireless communication device of claim 1, wherein the phoneme class is selected from a preselected group of at least four phoneme classes, and wherein the phoneme processor is further configured to select the phoneme class by outputting a probability value that a respective frame belongs to each of the at least four phoneme classes.

3. The wireless communication device of claim 2, wherein each phoneme class in the preselected group of phoneme classes corresponds to energy level of an audio signal frame and acoustic cues in the audio signal frame.

4. The wireless communication device of claim 1, further comprising:
    a speaker configured to receive the audio signal after the application of the dynamic range compression by the dynamic range controller; and
    wherein the audio signal is separated into the frequency based sub bands before being received by the phoneme processor.

5. The wireless communication device of claim 4, wherein the dynamic range controller includes separate compressors for each of the frequency based sub band.

6. The wireless communication device of claim 5, wherein each separate compressor processes a particular frequency sub band and compression is applied on the particular frequency sub band by applying a weight that is based on an output of the ambient noise estimator and an output of the phoneme processor.

7. The wireless communication device of claim 1, further comprising an ambient noise estimator and a microphone coupled to the ambient noise estimator to detect the ambient noise, and wherein the dynamic range controller is further configured and arranged to apply the compression and gains to energy levels of portions of the decoded audio signal based on the identified phoneme class and based on the detected ambient noise.

8. The wireless communication device of claim 1, configured as one of a mobile phone, a laptop, and a tablet computer, wherein the ambient noise estimator is configured to estimate an amount of the ambient noise at the wireless communication device, wherein the dynamic range controller is configured to apply an amount of dynamic range compression on the frames based on the estimated amount of ambient noise.

9. The wireless communication device of claim 1, wherein the codec and the ambient noise estimator are also configured as part of the computer processor with computer-executable instructions in a memory.

10. The wireless communication device of claim 1, wherein the dynamic range controller is configured to provide audio-signal signal enhancement by applying dynamic range compression based on the phoneme class and the detected ambient noise, the phoneme processor and dynamic range controller are configured and arranged to identify four phoneme classes in the frames, the four phoneme classes including fricatives, plosives, vowel-like consonants, and vowels and including different adjustments to an amount of gain or compression applied for the four phoneme classes based on the detected ambient noise.

11. The wireless communication device of claim 1, wherein the dynamic range compression applied by the dynamic range controller includes:
    classifying frames of a plurality of frequency sub bands into phoneme classes based upon a determined probability for the phoneme class in a corresponding frame; and
    applying, for each of the plurality of frequency sub bands, a weight to a respective set of compressor static characteristics that include a linear gain region and a compression region, the weight being modified as a function of a respective phoneme class and the respective ambient noise.

12. The wireless communication device of claim 11, further including a synthesizer configured and arranged to reconstruct an enhanced signal by combining the frequency sub bands from the dynamic range controller and providing the combined frequency sub bands as an output signal for broadcasting via a loudspeaker.

13. The wireless communication device of claim 11, further including: a limiter configured and arranged to prevent clipping in an output signal, and a synthesizer configured to reconstruct an enhanced signal by combining the frequency sub bands from the dynamic range controller and providing the combined frequency sub bands as the output signal for broadcasting via a loudspeaker.

14. A method of enhancing audio signal quality using a wireless communication device, the method comprising:
    wirelessly receiving, from a wireless communication device, an audio signal;
    decoding the audio signal;
    separating the decoded audio signal into different frequency sub-bands and frames within the sub-bands;
    detecting ambient noise in the frames; and
    enhancing audio signal quality, using a phoneme processor configured and arranged with a dynamic range controller of the wireless communication device by:
        extracting acoustic cues from frames of the decoded audio signal;
        identifying a phoneme class in the frames; and
        applying dynamic range compression on each frame based on the identified phoneme class and the detected ambient noise for a corresponding frame by:
            processing a plurality of frequency sub bands corresponding to the audio signal; and
            selecting, for each of the plurality of frequency sub bands, different dynamic range compression weights based upon the identified phoneme class and the detected ambient noise; and
            applying, for each of the plurality of frequency sub bands, the different dynamic range compression weight that are based on the identified phoneme classes and the detected ambient noise.

15. The method of enhancing audio signal quality of claim 14, wherein the dynamic range controller is arranged as part of a computer processor with computer-executable instructions in a memory of the wireless communication device, wherein the phoneme class is selected from a preselected group of phoneme classes, and wherein applying the dynamic range compression on each frame further includes applying compression and gains to energy levels of the frames of the decoded audio signal to enhance the decoded audio signal.

16. The method of enhancing audio signal quality of claim 15, wherein each phoneme class in the preselected group of phoneme classes corresponds to energy level of an audio signal frame and acoustic cues in the audio signal frame, wherein the dynamic range compression is applied based on the phoneme class and using the dynamic range controller that includes circuitry and is configured to enhance the decoded audio signal by applying the dynamic range compression.

17. The method of enhancing audio signal quality of claim 14, further comprising separating the audio signal into frequency based sub bands prior to identifying the phoneme class and providing a signal for broadcast via a speaker, from application of the dynamic range compression by the dynamic range controller.

18. The method of enhancing audio signal quality of claim 17, wherein applying the dynamic range compression includes compressing a dynamic range of each frequency based sub band independently.

19. The method of enhancing audio signal quality of claim 18, wherein the compressing each frequency based sub band includes applying compression in each frequency based sub band based on the identified phoneme class and an estimated ambient noise near a speaker providing audio based upon the dynamic range compression.

20. The method of enhancing audio signal quality of claim 14, further comprising estimating an amount of the ambient noise, wherein an amount of applied dynamic range compression on each frame is based on the estimated ambient noise, wherein the extraction of the acoustic cues from frames of the decoded audio signal and the identification of the phoneme class in the frames is performed using the phenome processor.

* * * * *